(12) United States Patent
Dastidar

(10) Patent No.: US 7,339,816 B1
(45) Date of Patent: Mar. 4, 2008

(54) SOFT ERROR TOLERANCE FOR CONFIGURATION MEMORY IN PROGRAMMABLE DEVICES

(75) Inventor: Jayabrata Ghosh Dastidar, San Jose, CA (US)

(73) Assignee: Altera Corporation, San Jose, CA (US)

( * ) Notice: Subject to any disclaimer, the term of this patent is extended or adjusted under 35 U.S.C. 154(b) by 196 days.

(21) Appl. No.: 11/340,949

(22) Filed: Jan. 27, 2006

(51) Int. Cl.
*G11C 7/00* (2006.01)

(52) U.S. Cl. ...................... 365/154; 365/156

(58) Field of Classification Search ............... 365/154, 365/156, 201
See application file for complete search history.

(56) References Cited

U.S. PATENT DOCUMENTS 6,876,572 B2 * 4/2005 Turner ..................... 365/156
2003/0097628 A1 * 5/2003 Ngo et al. ................ 714/736
2007/0109017 A1 * 5/2007 Liu et al. .................. 326/41

* cited by examiner

*Primary Examiner*—Vu A. Le
(74) *Attorney, Agent, or Firm*—Townsend and Townsend and Crew LLP (57) ABSTRACT

A memory device provides improved tolerance against soft errors. A guardian memory cell is connected with a single memory cell or multiple memory cells, which may be unrelated or associated with a single programmable device component. When a guardian cell stores a first guardian value, the connected memory cells are held to a first bit value. When a guardian cell stores a second value, each of the connected memory cells can store either the first bit value or a second bit value. The guardian cell is adapted to activate a pull-down or pull-up transistor of each connected memory cell to hold the connected memory cells to the first bit value. The first bit value is selected to maximize the number of memory cells protected by guardian cells.

23 Claims, 12 Drawing Sheets

| Inputs 605 | | | Function 610 | | | |
|---|---|---|---|---|---|---|
| A | B | C | AND | OR | NOR | NAND |
| 0 | 0 | 0 | 0 | 0 | 1 | 1 |
| 0 | 0 | 1 | 0 | 1 | 0 | 1 |
| 0 | 1 | 0 | 0 | 1 | 0 | 1 |
| 0 | 1 | 1 | 0 | 1 | 0 | 1 |
| 1 | 0 | 0 | 0 | 1 | 0 | 1 |
| 1 | 0 | 1 | 0 | 1 | 0 | 1 |
| 1 | 1 | 0 | 0 | 1 | 0 | 1 |
| 1 | 1 | 1 | 1 | 1 | 0 | 0 |

SOFT ERROR TOLERANCE FOR CONFIGURATION MEMORY IN PROGRAMMABLE DEVICES

BACKGROUND OF THE INVENTION

The present invention relates to the field of programmable devices, and the systems and methods for preventing configuration errors in the same. Programmable devices, such as FPGAs, typically includes thousands of programmable logic cells that use combinations of logic gates and/or look-up tables to perform a logic operation. Programmable devices also include a number of functional blocks having specialized logic devices adapted to specific logic operations, such as adders, multiply and accumulate circuits, phase-locked loops, and memory. The logic cells and functional blocks are interconnected with a configurable switching circuit. The configurable switching circuit selectively routes connections between the logic cells and functional blocks. By configuring the combination of logic cells, functional blocks, and the switching circuit, a programmable device can be adapted to perform virtually any type of information processing function.

The functions of a programmable device, such as an FPGA, are usually controlled by configuration data stored in a set of configuration RAM cells (CRAM). The configuration data in CRAM provides the logic signals used to configure the programmable device to implement its intended functions. Typically, the data in CRAM includes values of look-up tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. A copy of the configuration data is typically stored in a non-volatile memory, such as flash memory or ROM, that is within the same chip package as the programmable device or on an external configuration device connected with the programmable memory device. This copy of the configuration data is loaded into the CRAM cells of the programmable device to configure the programmable device to implement the desired functionality.

As the physical dimensions of CRAM cells decrease due to advances in manufacturing processes, the CRAM cells become more susceptible to spontaneous "soft errors." Soft errors may be induced by background radiation, such as alpha particles or cosmic rays, and result in CRAM cells spontaneously changing state from "0" to "1" or vice versa. As the function of the programmable device is determined by the data stored in CRAM cells, even a single change in a CRAM cell's state can change or disable the functions of the programmable device. Additionally, as programmable devices become more complicated and require additional CRAM cells to store their configuration data, the frequency of soft errors increases as well.

To mitigate the problems caused by soft errors, CRAM cells are often specially designed to resist soft errors. However, many of these special CRAM cell designs are difficult to efficiently scale down to smaller manufacturing processes. Additionally, programmable devices can include error detection and/or correction circuits adapted to detect and/or correct soft errors after they occur. Typically, upon detecting a soft error in the CRAM cells, the error detection circuitry initiates a reconfiguration operation that reloads configuration data from the non-volatile memory or external configuration device into the CRAM cells of the programmable device. Although error detection circuits allow for correction of soft errors that have occurred, they do not prevent a programmable device from malfunctioning between the time that the soft error occurs and its detection. Additionally, the normal operations of the programmable device are disabled during the reconfiguration operation. Thus, overall programmable device performance is degraded by the constant occurrence and correction of soft errors in CRAM cells.

It is therefore desirable for a system and method of encoding and storing configuration data in CRAM cells to greatly reduce the probability of soft errors. It is further desirable for this system and method to scale down in size efficiently as manufacturing processing improve. It is further desirable for this system and method to be simple to implement in programmable devices without requiring substantial modifications or overhead.

BRIEF SUMMARY OF THE INVENTION

In an embodiment of the invention, a memory device provides improved tolerance against soft errors. A guardian memory cell is connected with a single memory cell or multiple memory cells, which may be unrelated or associated with a single programmable device component. When a guardian cell stores a first guardian value, the connected memory cells are held to a first bit value. When a guardian cell stores a second value, each of the connected memory cells can store either the first bit value or a second bit value. In an embodiment, the guardian cell is adapted to activate a pull-down transistor or pull-up transistor of each connected memory cell to hold the connected memory cells to the first bit value. In an embodiment, the first bit value is selected to maximize the number of memory cells protected by guardian cells.

In an embodiment of the invention, a configuration memory for a programmable device includes a first configuration memory cell adapted to specify a portion of a configuration of the programmable device. The first configuration memory cell includes a first node adapted to store a first voltage potential corresponding with a configuration bit value and a first transistor connected with a first voltage potential source. This embodiment also includes a guardian configuration memory cell connected with the first configuration memory cell and adapted to store a guardian bit. The first transistor is adapted to hold the first node at the first voltage potential in response to the guardian bit having a first guardian bit value.

In a further embodiment, the guardian configuration memory cell includes a second node. The first transistor of the first configuration memory cell is connected with the second node. The first transistor electrically connects the first node with the first voltage potential source in response to the guardian bit having the first value.

In another embodiment, the second node is adapted to store a second voltage potential corresponding with the first guardian bit value. In still another embodiment, the second node is adapted to store a second voltage potential corresponding with the logical inverse of the first guardian bit value. In an additional embodiment, the connection between the first transistor and the second node includes an inverter.

In still a further embodiment, the configuration memory includes a second configuration memory cell adapted to specify a portion of a configuration of the programmable device. The second configuration memory cell includes a second node adapted to store a second voltage potential corresponding with a second configuration bit value and a second transistor connected between the second node of the second configuration memory cell and the first voltage potential source. In this embodiment, the guardian configuration memory cell is further connected with the second configuration memory cell. In response to the guardian bit having the first guardian bit value, the second transistor is adapted to hold the second node at the voltage potential. In an additional embodiment, the first and second configuration memory cells may specify at least a portion of a configuration of a single programmable device component.

BRIEF DESCRIPTION OF THE DRAWINGS

The invention will be described with reference to the drawings, in which.

DETAILED DESCRIPTION OF THE INVENTION

Figure 1A:
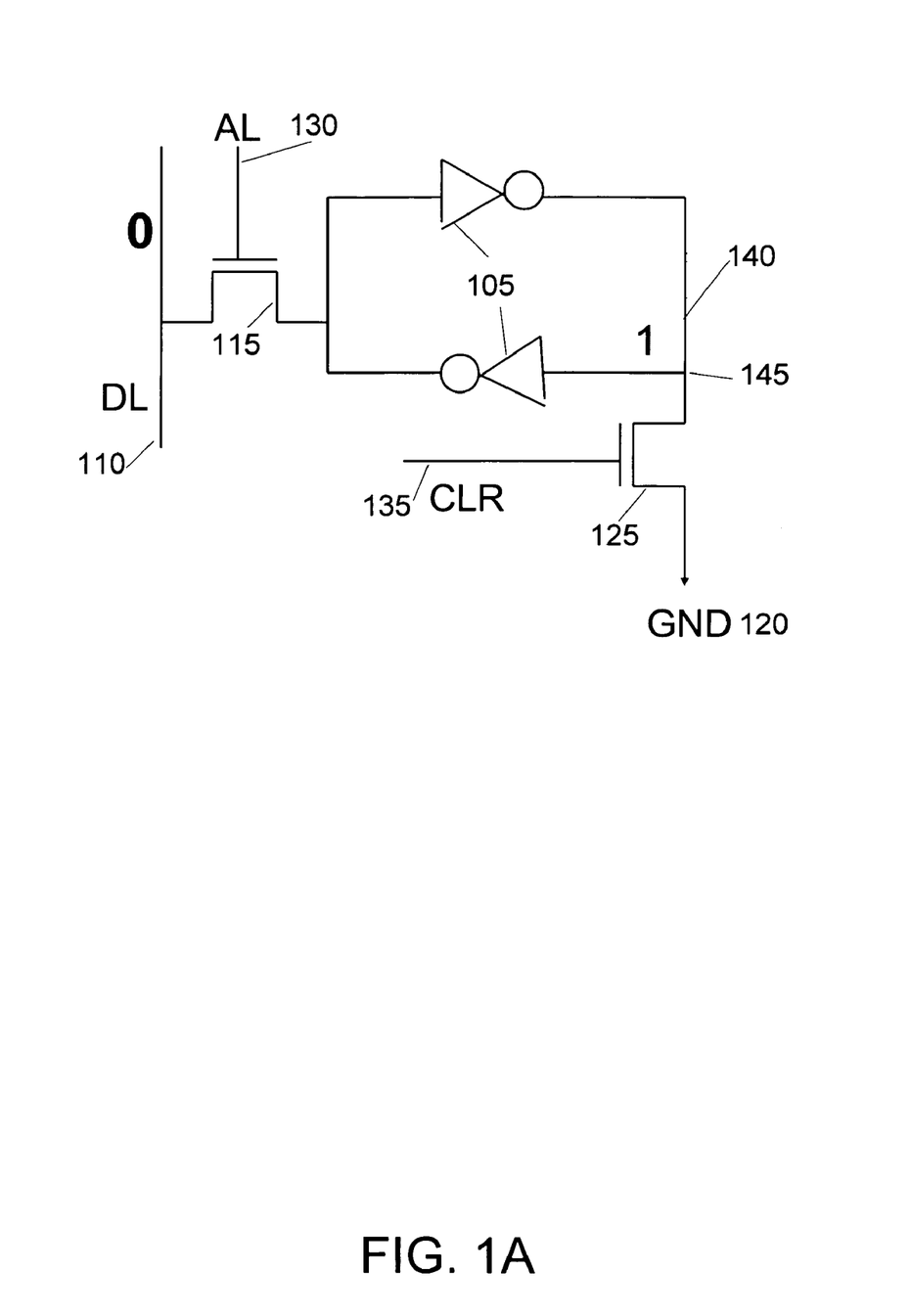
FIGS. 1A-1B illustrate example configuration RAM (CRAM) cells suitable for use by an embodiment of the invention.

FIG. 1A illustrates an example configuration RAM (CRAM) cell 100 suitable for use by an embodiment of the invention. Example CRAM cell 100 includes a pair of inverters 105 configured to operate as a latch capable of storing one bit of data. The pair of inverters 105 are connected with a data line 110 via access transistor 115 and with a ground potential 120 via clear transistor 125. In an embodiment, access transistor 115 is controlled with access line input 130 and clear transistor 125 is controlled with clear input 135.

CRAM cell 100 includes a configuration data output 140. Configuration data output 140 provides the data stored in CRAM cell to one or more portions of the programmable device. Configuration data output 140 can be used to provide a look-up table value used to implement a logic function; a configuration of a logic cell, specialized functional block, memory unit, multiply and accumulate unit, input-output unit, or other component of the programmable device; a portion of the configuration of a programmable switching circuit used to route connections within the programmable device; or any other configurable aspect of a programmable device.

In an embodiment, CRAM cell 100 is programmed with configuration data as follows. To program a "1" or high logic voltage level value in the CRAM cell 100, the data line 110 is set with a "0" value and the access transistor 115 is activated. This in turn sets the output node 145 and the configuration output 140 of the CRAM cell 100 to a "1." To program a "0" or low logic voltage level value in the CRAM cell 100, clear transistor 125 is activated, which sets the output node 145 and configuration data output 140 to ground. Once the output node 145 has been set to a high or low logic voltage level value, the pair of inverters 105 will retain this value until the CRAM cell 100 is reprogrammed or a soft error occurs.

Programmable devices typically include millions of CRAM cells similar to CRAM cell 100. In an embodiment, the access transistors 115 of the CRAM cells are individually addressable, while the clear transistors 125 of several CRAM cells are controlled by the same clear input 135. As discussed in detail below, the number of CRAM cells controlled with a single clear input 135 can be selected to optimize the efficiency of embodiments of the invention.

In embodiments where the clear transistors of a set of CRAM cells are controlled by a single clear input, the set of CRAM cells are programmed as follows. First, the single clear input is used to activate all of the clear transistors 125 of the set of CRAM cells. This sets all of the set of CRAM cells to "0" or a low logic voltage level. Then, for each one of the set of CRAM cells that should be programmed to a "1" or high logic voltage level, the appropriate data line is set to "0" and the appropriate access transistor 115 is selectively activated, thereby setting this CRAM cell to a "1." The remainder of the set of CRAM cells retain the "0" value.

In alternate embodiments, this configuration can be reversed, with individually addressable clear transistors 125 and access transistors 115 of a set of CRAM cells controlled by the same access line input 130. The programming of the set of CRAM cells is performed in a similar manner, with all CRAM cells initially set to "1" via the access transistors 115 and then selected CRAM cells reprogrammed to "0" via their respective clear transistors 125.

Figure 1B:
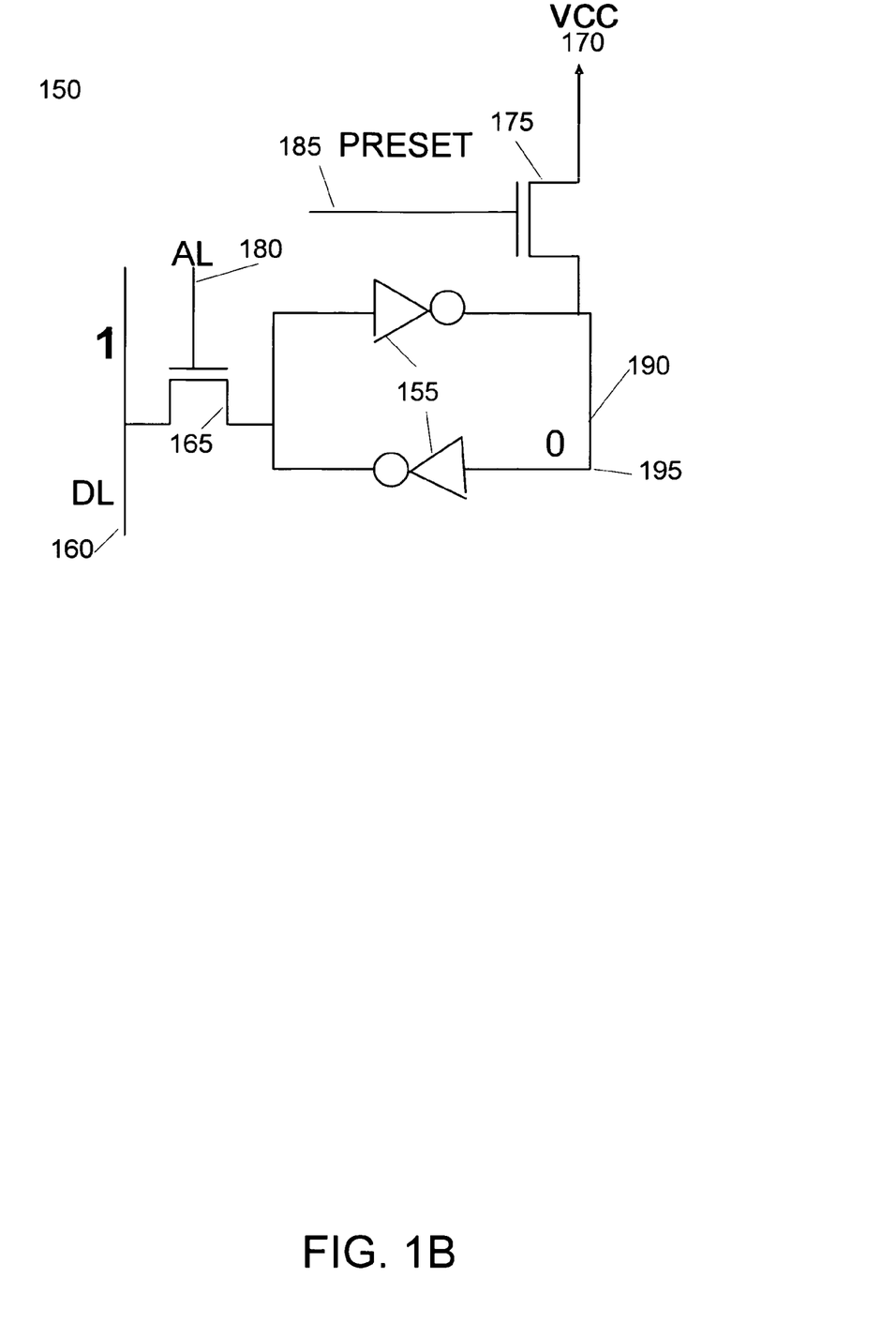

FIG. 1B illustrates an example configuration RAM (CRAM) cell 150 suitable for use by an embodiment of the invention. Example CRAM cell 150 includes a pair of inverters 155 configured to operate as a latch capable of storing one bit of data. The pair of inverters 155 are connected with a data line 160 via access transistor 165 and with a positive supply voltage potential Vcc 170 via preset transistor 175. In an embodiment, access transistor 165 is controlled with access line input 180 and preset transistor 175 is controlled with present input 185.

CRAM cell 150 includes a configuration data output 190. Configuration data output 190 provides the data stored in CRAM cell to one or more portions of the programmable device. Configuration data output 190 can be used to provide a look-up table value used to implement a logic function; a configuration of a logic cell, specialized functional block, memory unit, multiply and accumulate unit, input-output unit, or other component of the programmable device; a portion of the configuration of a programmable switching circuit used to route connections within the programmable device; or any other configurable aspect of a programmable device.

In an embodiment, CRAM cell 150 is programmed with configuration data as follows. To program a "0" or low logic voltage level value in the CRAM cell 150, the data line 160 is set with a "1" value and the access transistor 165 is activated. This in turn sets the output node 195 and the configuration output 190 of the CRAM cell 150 to a "0." To program a "1" or high logic voltage level value in the CRAM cell 150, preset transistor 175 is activated, which sets the output node 195 and configuration data output 190 to Vcc. Once the output node 195 has been set to a high or low logic voltage level value, the pair of inverters 155 will retain this value until the CRAM cell 150 is reprogrammed or a soft error occurs.

Programmable devices typically include millions of CRAM cells similar to CRAM cell 150. In an embodiment, the access transistors 165 of the CRAM cells are individually addressable, while the preset transistors 175 of several CRAM cells are controlled by the same preset input 185. As discussed in detail below, the number of CRAM cells controlled with a single preset input 185 can be selected to optimize the efficiency of embodiments of the invention.

In embodiments where the preset transistors of a set of CRAM cells are controlled by a single preset input, the set of CRAM cells are programmed as follows. First, the single preset input is used to activate all of the preset transistors 125 of the set of CRAM cells. This sets all of the set of CRAM cells to "1" or a high logic voltage level. Then, for each one of the set of CRAM cells that should be programmed to a "0" or low logic voltage level, the appropriate data line is set to "1" and the appropriate access transistor 165 is selectively activated, thereby setting this CRAM cell to a "0." The remainder of the set of CRAM cells retain the "1" value.

In alternate embodiments, this configuration can be reversed, with individually addressable preset transistors 175 and access transistors 165 of a set of CRAM cells controlled by the same access line input 180. The programming of the set of CRAM cells is performed in a similar manner, with all CRAM cells initially set to "0" using the access transistors 165 and then selected CRAM cells reprogrammed to "1" via their respective preset transistors 175.

Figure 2A:
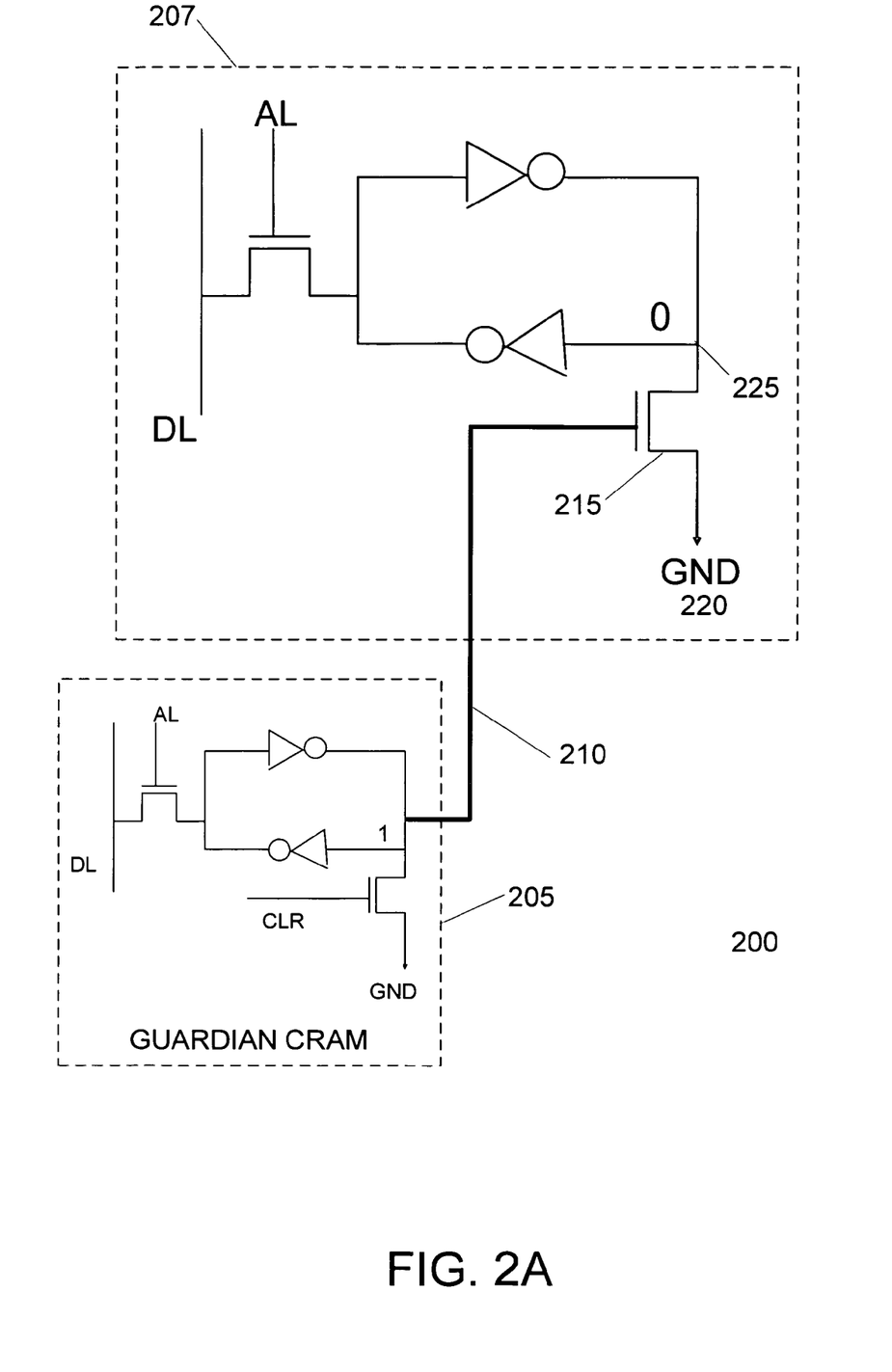
FIGS. 2A-2B illustrate example arrangements of CRAM cells providing improved tolerance against soft errors according to embodiments of the invention.

FIG. 2A illustrate an example arrangement 200 of CRAM cells providing improved tolerance against soft errors according to embodiments of the invention. Arrangement 200 includes a first CRAM cell 207 used to store configuration data of the programmable device, as described above. In this embodiment, a second CRAM cell 205, referred to as a guardian CRAM cell, is used to provide improved resistance against soft errors.

The output 210 of the guardian CRAM cell 205 is connected with the clear transistor 215 of CRAM cell 207. If CRAM cell 207 is to be programmed with a "0," then this embodiment of the guardian CRAM cell 205 can be programmed with a "1." In this configuration, the output 210 of guardian CRAM cell 205 keeps the clear transistor 215 activated, thereby forming a continuous connection between the output node 225 and ground node 220. In the event that a cosmic ray, alpha particle, or other soft error inducing entity strikes the CRAM cell 207, the connection between the output node 225 and the ground node 220 prevents the output node 225 from switching from a "0" to "1." Thus, this configuration of the guardian CRAM cell 205 protects against soft errors in CRAM cell 207 when the CRAM cell is programmed with a "0."

Moreover, if a soft error occurs in the guardian CRAM cell 207, then the clear transistor 215 will be deactivated. Although this disconnects the output node 225 from the ground node 220, the output node 225 will still retain its "0" value. The only way that a soft error can affect the output of CRAM cell 207 is if there is first a soft error in guardian CRAM cell 205 and then a second soft error in CRAM cell 207. The probability of this occurring is typically negligible.

Furthermore, the programmable device can include an error detection circuit that continuously scans for errors in the CRAM cell 207 and guardian CRAM cell 205. Typically, an error detection circuit can detect and correct a soft error within a small time period, such as 100 ms or less. Thus, two soft errors would have to occur within this narrow time period, first in the guardian CRAM cell 205 and then the CRAM cell 207, in order for the CRAM cell 207 to change from a "0" to a "1" due to soft errors.

When the CRAM cell 207 is programmed with a "1," the guardian CRAM cell 205 is set to "0," so that the clear transistor is deactivated. In this configuration, there is no additional protection from soft errors. In an alternate embodiment, the configuration of CRAM cell 207 and guardian CRAM cell 205 can modified to prevent soft errors when the CRAM cell 207 is programmed with a "1." For example, the clear transistor 215 of CRAM cell 207 can be connected with a high logic voltage level, rather than a ground potential. In this modified form, the guardian CRAM cell 205 provides additional protection against soft errors when CRAM cell 207 is programmed with a "1," but no additional protection against soft errors when the CRAM cell 207 is programmed with a "0."

Because these above-described embodiments provide additional soft error protection for only one state of a CRAM cell, applications of these embodiments may be adapted to protect the most common state of its CRAM cells. For example, if a programmable device typically programs its CRAM cells with more "0" states than "1" states, then guardian CRAM cells may be configured to provide soft error protection for CRAM cells in the "0" state to maximize the soft error resistance of the programmable device.

Figure 2B:
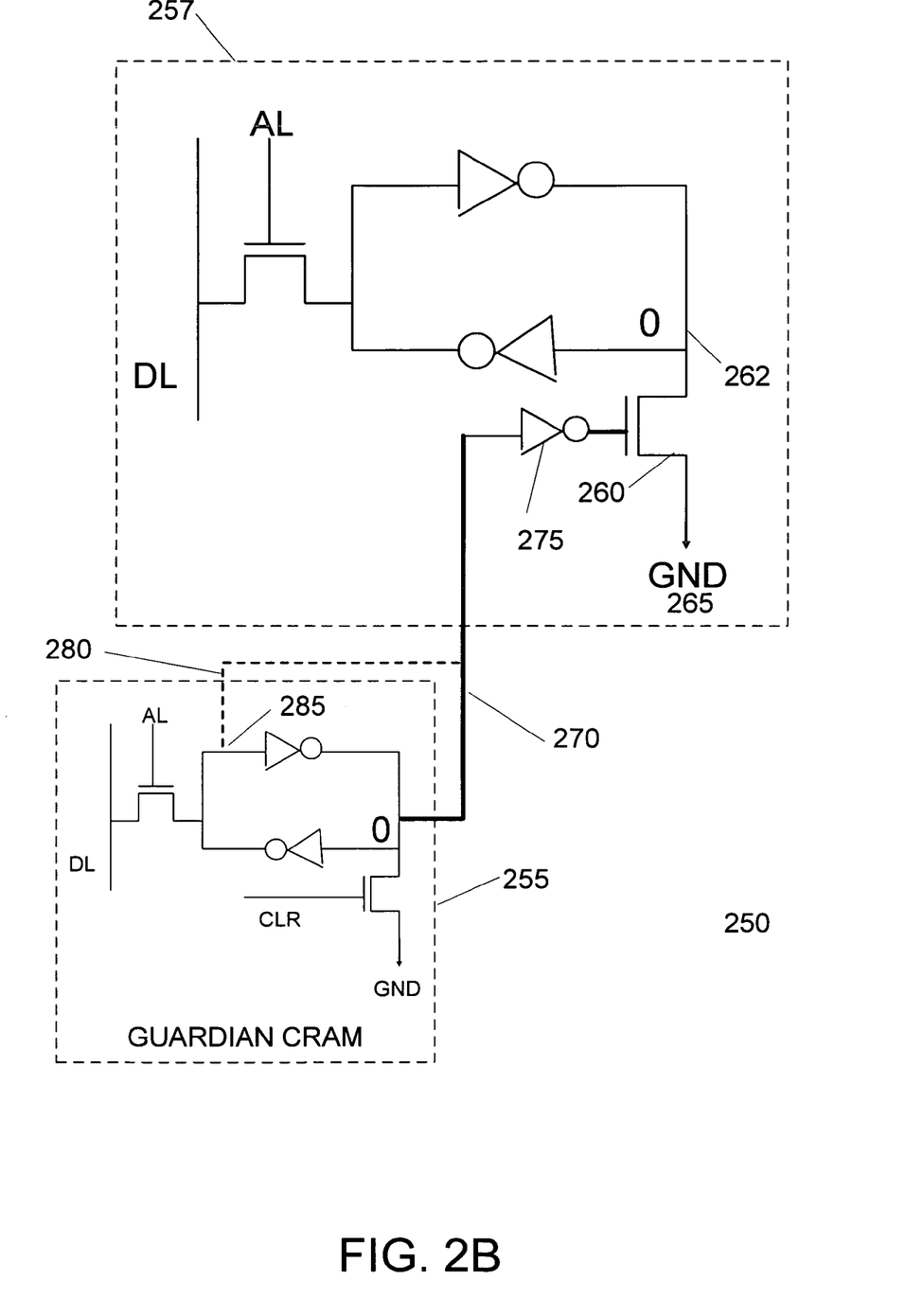

FIG. 2B illustrate an example arrangement 250 of CRAM cells providing improved tolerance against soft errors according to an embodiment of the invention. In this embodiment, guardian CRAM cell 255 is connected with the clear transistor 260 of CRAM cell 257. However, in this embodiment, the guardian CRAM cell 255 is programmed with a "0" state to provide additional soft error protection for CRAM cell 257.

When guardian CRAM cell 255 outputs a "0" via output 270, inverter 275 inverts the "0" to a "1." This inverted signal then activates clear transistor 260, which connects the output node 262 of CRAM cell 257 with ground node 265, thereby holding CRAM cell 255 in the "0" state despite the occurrence of a soft error.

Other embodiments of arrangement 250 are possible. For example, clear transistor 260 can be a PMOS transistor, which eliminates the need for inverter 275. In another alternate embodiment, the output 270 of the guardian CRAM cell 255 is connected via path 280 with the opposite inverted node 280. This embodiment also does not require inverter 275.

In an embodiment, a programmable device includes a guardian CRAM cell for each CRAM cell, thereby providing improved soft error protection for every CRAM cell programmed with the appropriate state. Other embodiments provide improved soft error protection for groups of CRAM cells having the same state while requiring fewer guardian CRAM cells. In these embodiments, groups of two or more CRAM cells can be protected by a single guardian CRAM cell.

Figure 3:
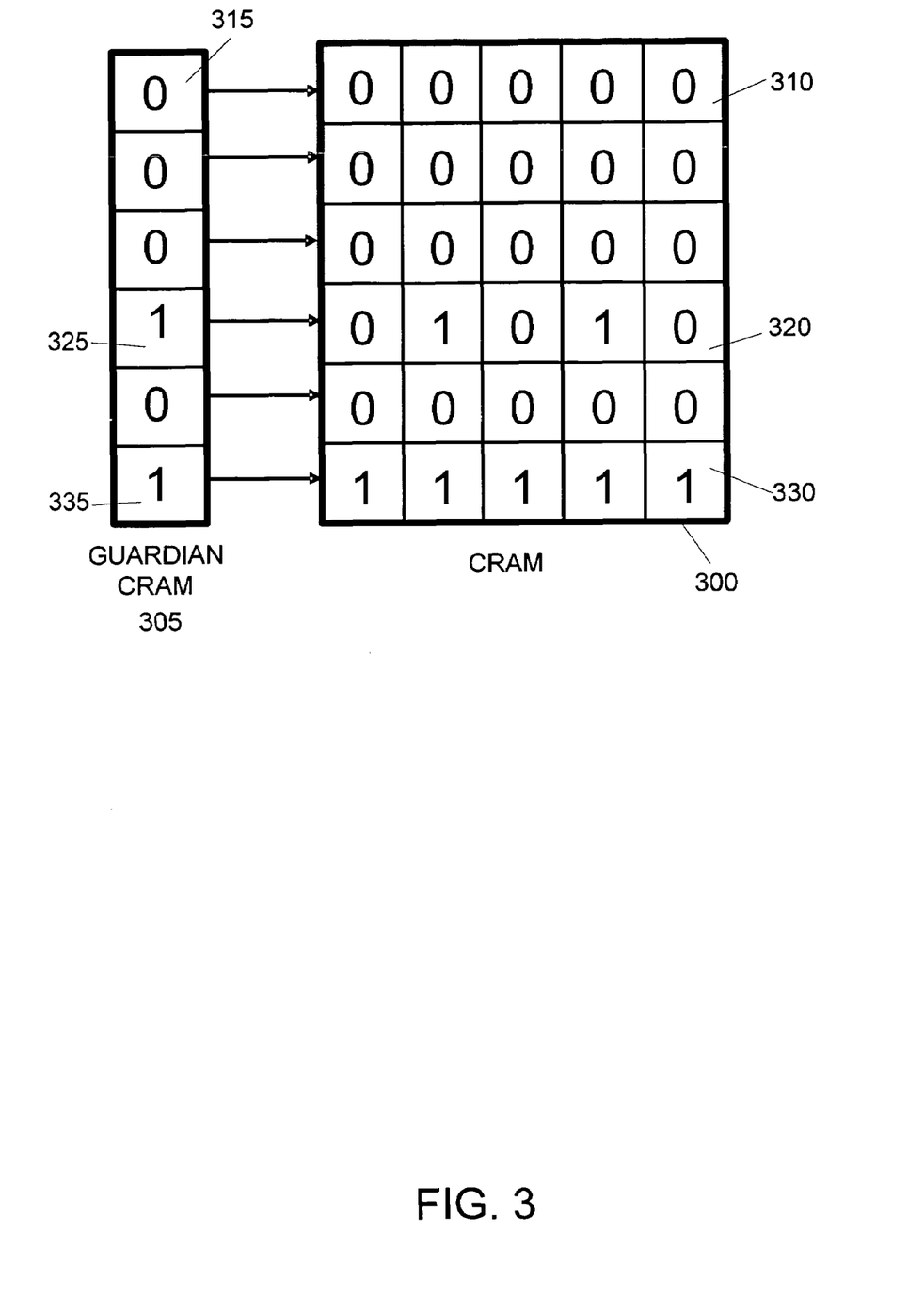
FIG. 3 illustrates an example arrangement of CRAM cells providing improved tolerance against soft errors according to an embodiment of the invention.

FIG. 3 illustrates an example arrangement of CRAM cells providing improved tolerance against soft errors according to an embodiment of the invention. In this embodiment, an array of CRAM cells 300 is connected with a set of guardian CRAM cells 305. In an embodiment, each guardian CRAM cell provides soft error protection for a set of five CRAM cells. For example, guardian CRAM cell 315 provides soft error protection for row 310 of CRAM cells. In this embodiment, the guardian CRAM cell 315 provides soft error protection for its associated row 310 of CRAM cells if all of these CRAM cells have the same state. For example, if the guardian CRAM cells are configured to protect the "0" state of CRAM cells, then row 310 of CRAM cells, which are all set to "0" in this example, can be protected by guardian CRAM cell 315. In this example, guardian CRAM cell 315 is set to "0," which activates the clear transistors associated with the row 310 of CRAM cells, thereby providing additional soft error protection. In this example, the clear transistors associated with CRAM cells may be PMOS transistors or inverters coupled with NMOS transistors, as described above. In further embodiments, the guardian CRAM cell 315 can be similarly configured to activate preset transistors of one or more CRAM cells like CRAM cell 150 discussed above.

In contrast, row 320 of CRAM cells includes both "0" and "1" states and cannot be protected by guardian CRAM cell 325. Thus, guardian CRAM cell 325 is set to "1," which deactivates the clear transistors associated with row 320 of CRAM cells. Similarly, the CRAM cells of row 330 are all set to "1." if guardian CRAM cell 335 is configured to protect the "0" state of its associated CRAM cells in row 330, then in this example, guardian CRAM cell 335 cannot provide soft error protection to row 330 when these CRAM cells are set to this state. As a result, guardian CRAM cell 335 is set to "1," which deactivates the clear transistors associated with row 330 of CRAM cells.

In an embodiment, the array of CRAM cells 300 is divided into equal sized portions, such as portions of five CRAM cells each. Each portion is then associated with a guardian CRAM cell, which can be used to provide additional soft error protection when all of the CRAM cells in the associated portion are set to the same state value. Alternate embodiments of the invention can use portions with fewer CRAM cells, which requires additional guardian CRAM cells, or portions with additional CRAM cells, which decreases the required number of guardian CRAM cells.

In further embodiments, guardian CRAM cells can be associated with one or more CRAM cells based on the components and architecture of the programmable device. For example, a group of CRAM cells that are commonly used together to configure a component of the programmable device can be associated with one or more guardian CRAM cells.

FIGS. 4A-4D illustrate further example arrangements of CRAM cells providing improved tolerance against soft errors according to embodiments of the invention. Arrangement 400 includes a programmable device component 405, which in this example is a multiplexer but can be any other portion of a programmable device. Component 405 is configured by the set of CRAM cells 410. In this embodiment, each one of a set of guardian CRAM cells 415 are associated with one of the set CRAM cells 410. This embodiment enables additional soft error protection for any of the set of CRAM cells 410 that is set to the appropriate state value.

Figure 4A:
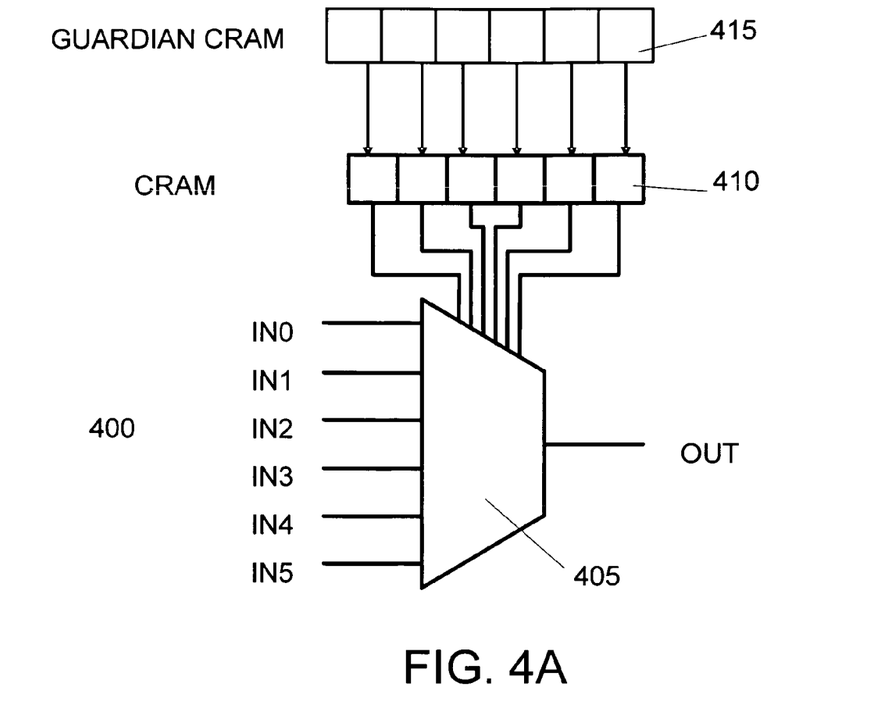
FIGS. 4A-4D illustrate further example arrangements of CRAM cells providing improved tolerance against soft errors according to embodiments of the invention.
Figure 4B:
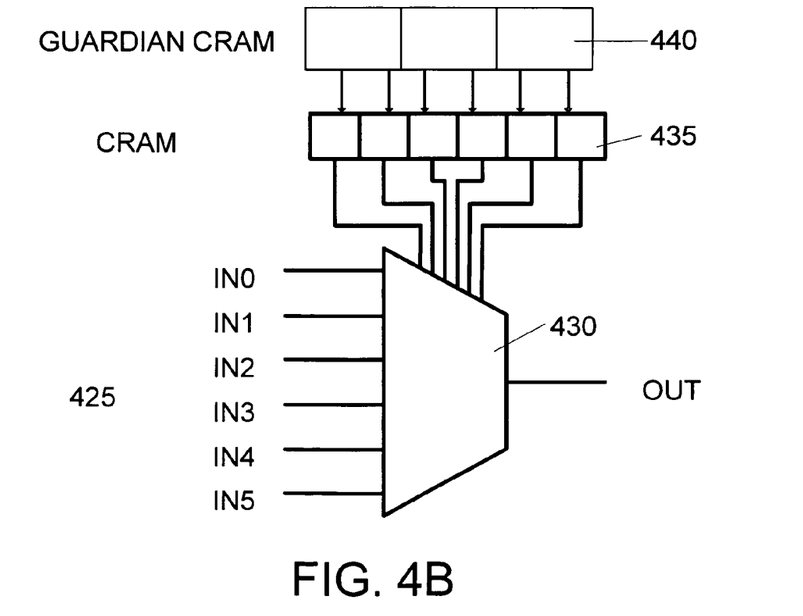

Arrangement 425 includes a programmable device component 430, which in this example is a multiplexer but can be any other portion of a programmable device. Component 430 is configured by the set of CRAM cells 435. In this embodiment, each one of a set of guardian CRAM cells 440 are associated with a pair of the set CRAM cells 425. This embodiment enables additional soft error protection for any pair of the set of CRAM cells 435 that is set to the appropriate state value.

Figure 4C:
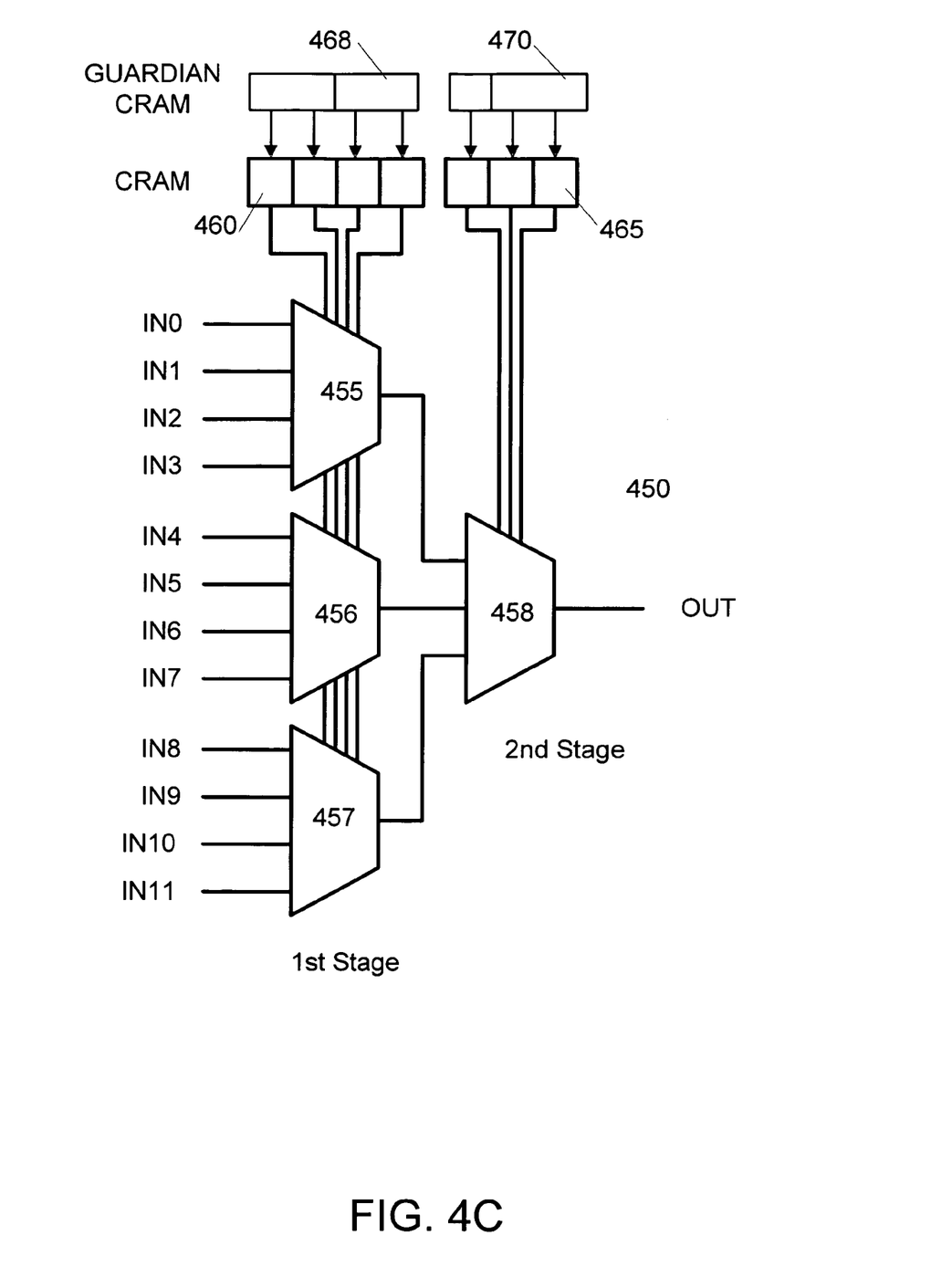

Arrangement 450 includes programmable device components 455, 456, 457, and 458, which in this example are multiplexers but can be any other portions of a programmable device. In this example, components 455, 456, and 457 are configured by the set of CRAM cells 460. Additionally, component 458 is configured by the set of CRAM cells 465. In this embodiment, each one of a set of guardian CRAM cells 468 are associated with a pair of the set CRAM cells 460. Additionally, the one of the two cells of the set of guardian CRAM cells 465 are associated with a pair of the set of CRAM cells 465, while the other cell of the set of guardian CRAM cells 465 is associated with a single CRAM cell in set 465. This embodiment enables additional soft error protection for the associated single CRAM cell or pairs of CRAM cells in set 460 or 465 that are set to the appropriate state value.

Figure 4D:
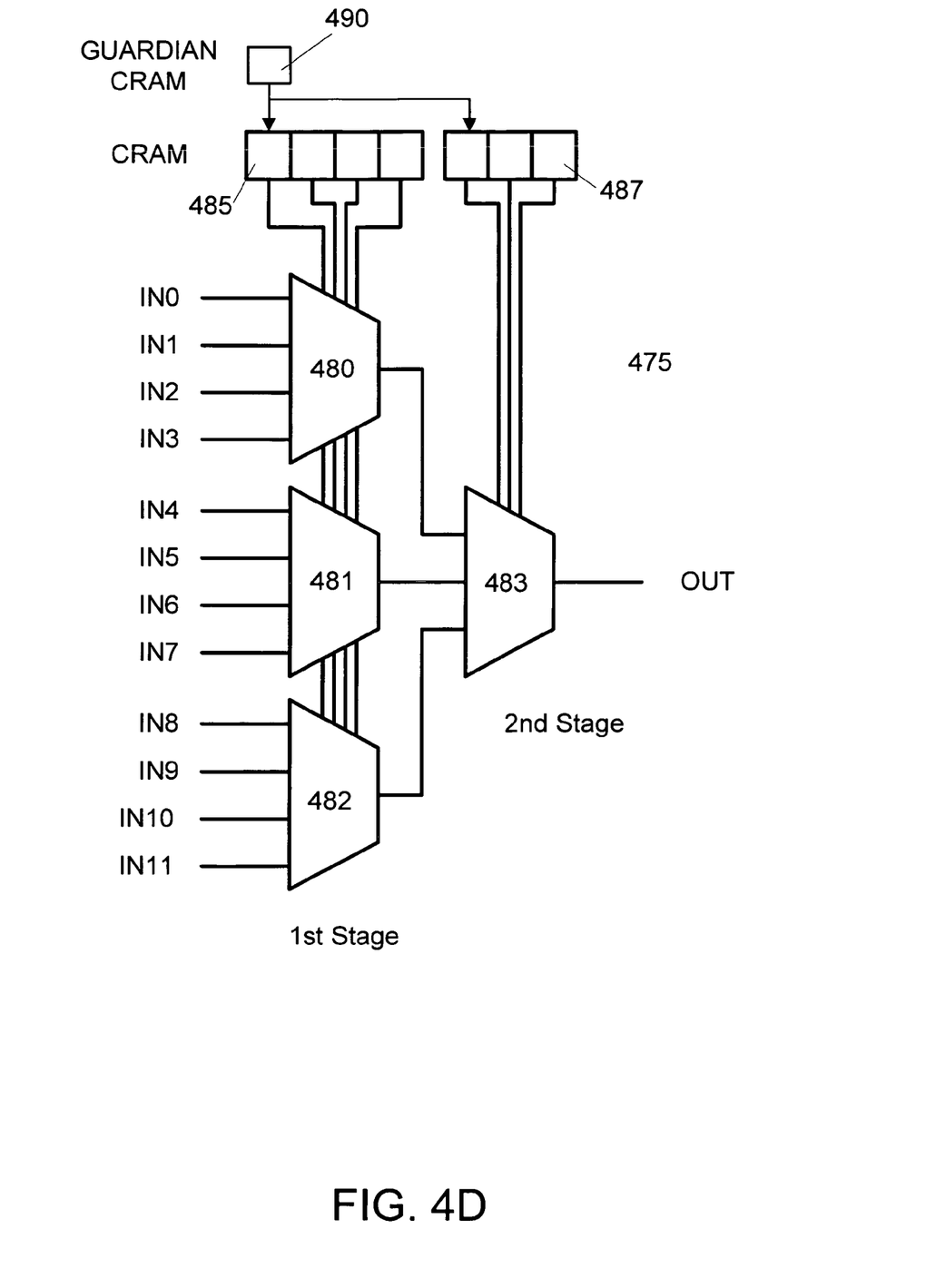

Arrangement 475 includes programmable device components 480, 481, 482, and 483, which in this example are multiplexers but can be any other portions of a programmable device. In this example, components 480, 481, and 482 are configured by the set of CRAM cells 485. Additionally, component 483 is configured by the set of CRAM cells 487. In this embodiment, a guardian CRAM cell 490 is associated with one or more CRAM cells in both set 485 and set 487. Additional guardian CRAM cells, omitted for clarity, can be associated with CRAM cells in set 485 and set 487. In this embodiment, a guardian CRAM cell can provide additional soft error protection when the associated CRAM cells in set 485 and set 487 are set to the appropriate state value.

In further embodiments, statistical analysis of the configuration data for one or more typical programmable device configurations can be used to determine an optimal arrangement of guardian CRAM cells. In these embodiment, the configuration data for a representative sample of programmable device configurations can be analyzed to identify groups of CRAM cells that are typically set to the same state values. Fewer guardian CRAM cells can be associated with these groups of CRAM cells, as they often share the same state values. For groups of CRAM cells with lower likelihoods of having the same state values, more guardian CRAM cells can be allocated to provide additional soft error protection.

Figure 5:
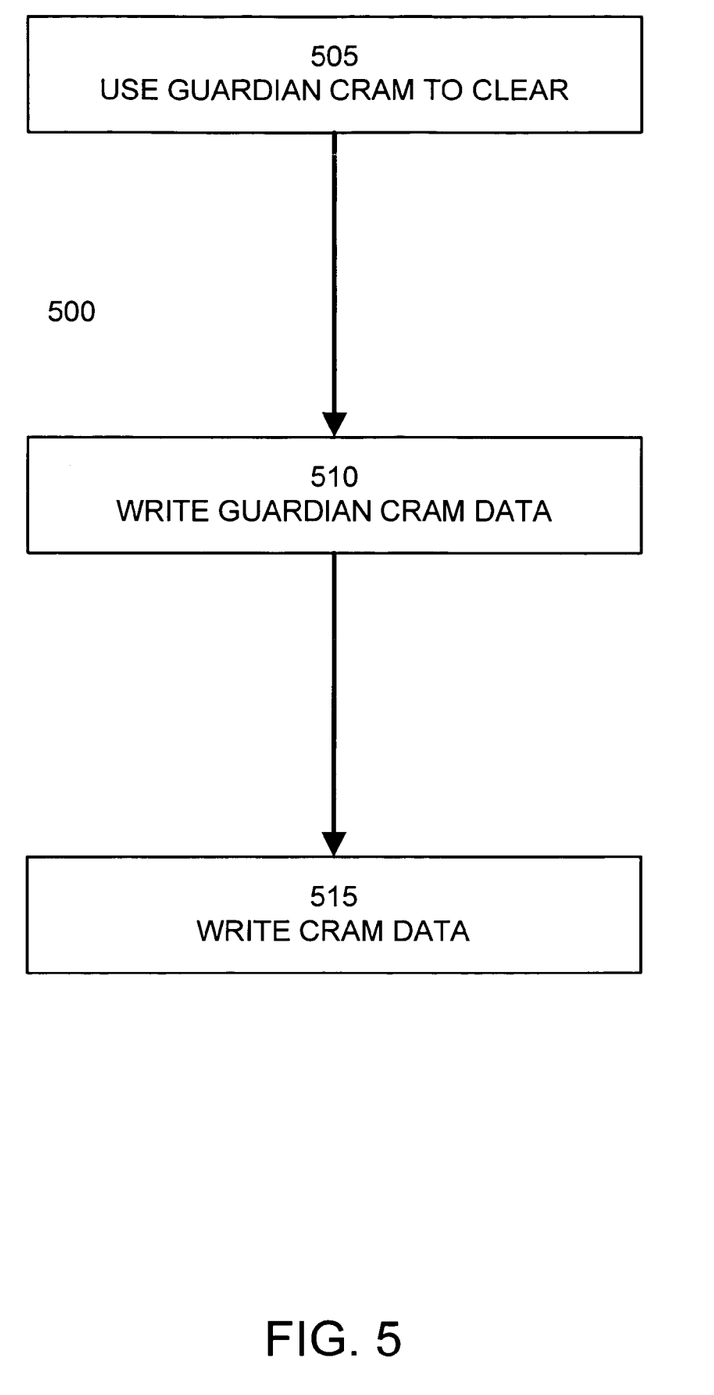
FIG. 5 illustrates a method of loading configuration data into CRAM cells according to an embodiment of the invention.

FIG. 5 illustrates a method 500 of loading configuration data into CRAM cells of a programmable device according to an embodiment of the invention. At step 505, all of the guardian CRAM cells are set to a value that clears their associated CRAM cells. For example, a "0" state in a guardian CRAM cell may activate the clear transistor of one of more associated CRAM cells, thereby setting these associated CRAM cells to the "0" state. Step 505 sets the states of all of the guardian CRAM cells to the appropriate value so that all of their associated CRAM cells are set to the "0" state.

Following step 505, all of the CRAM cells associated with guardian CRAM cells are set to the "0" state. Step 510 writes guardian CRAM data to at least some of the guardian CRAM cells. In an embodiment in which the "0" state is protected against soft errors, the guardian CRAM data configures guardian CRAM cells to deactivate clear transistors of one or more associated CRAM cells. For example, a "1" state in a guardian CRAM cell may deactivate the clear transistor of one of more associated CRAM cells. Despite the deactivation of their clear transistors, the associated CRAM cells will remain in the "0" state unless other programmed.

In an embodiment of step 510, a guardian CRAM cell is loaded with guardian CRAM data if at least one associated CRAM cell is to be assigned a state value by the configuration data that is not protected against soft errors. For example, if the guardian CRAM cell is configured to protect against soft errors occurring in the "0" of a CRAM cell, but the configuration data requires the associated CRAM cell to be set to a "1" state, then the guardian CRAM data will be loaded into the guardian CRAM cell associated with this CRAM cell. This deactivates this associated CRAM cell's clear transistor, which will allow it to be programmed to a "1" state by the configuration data.

Following step 510, all of the CRAM cells will still be set to the "0" state. However, the guardian CRAM data will have deactivated the clear transistors of some of these CRAM cells. Step 515 then writes configuration data to the appropriate CRAM cells. In an embodiment, the configuration data writes "1" states to the appropriate CRAM cells as required by the programmable device configuration. In an embodiment in which each guardian CRAM cell is associated with a single CRAM cell, configuration data will be written into each CRAM cell having a clear transistor deactivated by its associated guardian transistor. In embodiments in which the guardian transistor is associated with two or more CRAM cells, configuration data may be written to only a portion of the CRAM cells having their clear transistors deactivated by their associated guardian CRAM cell.

Following step 515, some CRAM cells will have retained the initial "0" state as set in step 505. Of these CRAM cells with the "0" state, at least a portion of these CRAM cells will have clear transistors being held in the activated state by associated guardian CRAM cells. This portion of the CRAM cells will have improved resistance to soft errors, as described above. The remaining portion of CRAM cells with deactivated clear transistors will retain their "0" state values, but will not have any additional resistance against soft errors. Similarly, the CRAM cells set to the "1" state in this example will also not have any additional resistance against soft errors.

As discussed above, embodiments of the invention provide improved resistance to soft errors for only one of the two states of a CRAM cell. To maximize the programmable device's overall resistance to soft errors, it is desirable to maximize the number of CRAM cells having the state value protected by guardian CRAM cells. To this end, an embodiment of the invention considers soft error resistance in determining the configuration data of the programmable.

Configuration data of a programmable device is generated by one or more software applications during a process referred to as compilation. During compilation, a functional description of a desired programmable device application is converted to configuration data. Often during compilation, the compilation software can select between two or more equivalent functions to implement a portion of the application. In these situations, the compilation software may be adapted to select the function that would provide the most resistance against soft errors.

Figure 6:
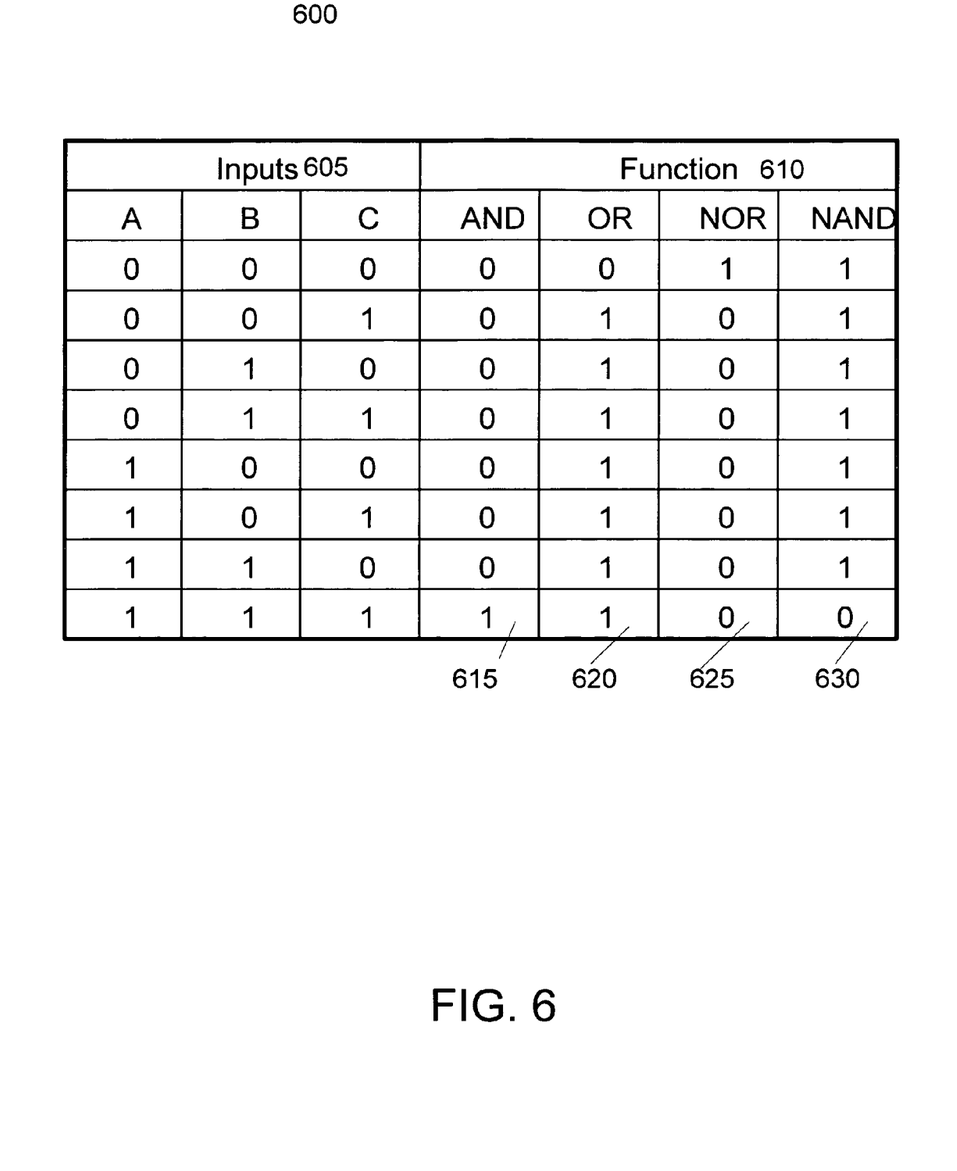
FIG. 6 illustrates equivalent logic functions that can be utilized in creating programmable device configuration data to improve soft error tolerance according to an embodiment of the invention.

For example, FIG. 6 illustrates a table 600 of equivalent logic functions that can be utilized in creating programmable device configuration data to improve soft error tolerance according to an embodiment of the invention. Table 600 includes a set of function input values 605 and corresponding function output values 610. Table 600 includes an AND function, 615, OR function, 620, NOR function 625, and NAND function, 630.

AND function 615 and NAND function 630 are logical inverses and can often be used interchangeably in an application, sometimes requiring the addition of an inverter gate. Either of these functions can be implemented using a lookup table in the programmable device. The values of the lookup table are stored in CRAM cells.

If the guardian CRAM cells of a programmable device are configured to protect the "0" state of CRAM cells, then the compilation process can select the function that includes the most "0" states in its output to provide the most resistance against soft errors. In this example, the output of the AND function 615 includes seven "0" states and one "1" state and is therefore more resistant to soft errors for this configuration. Thus, the compilation process can select AND functions instead of NAND functions to allow for improved resistance against soft errors.

Similarly, OR function 620 and NOR function 625 are often interchangeable in an application. The compilation process can therefore select NOR function 625, which has more "0" states, over OR function 620.

Figure 7:
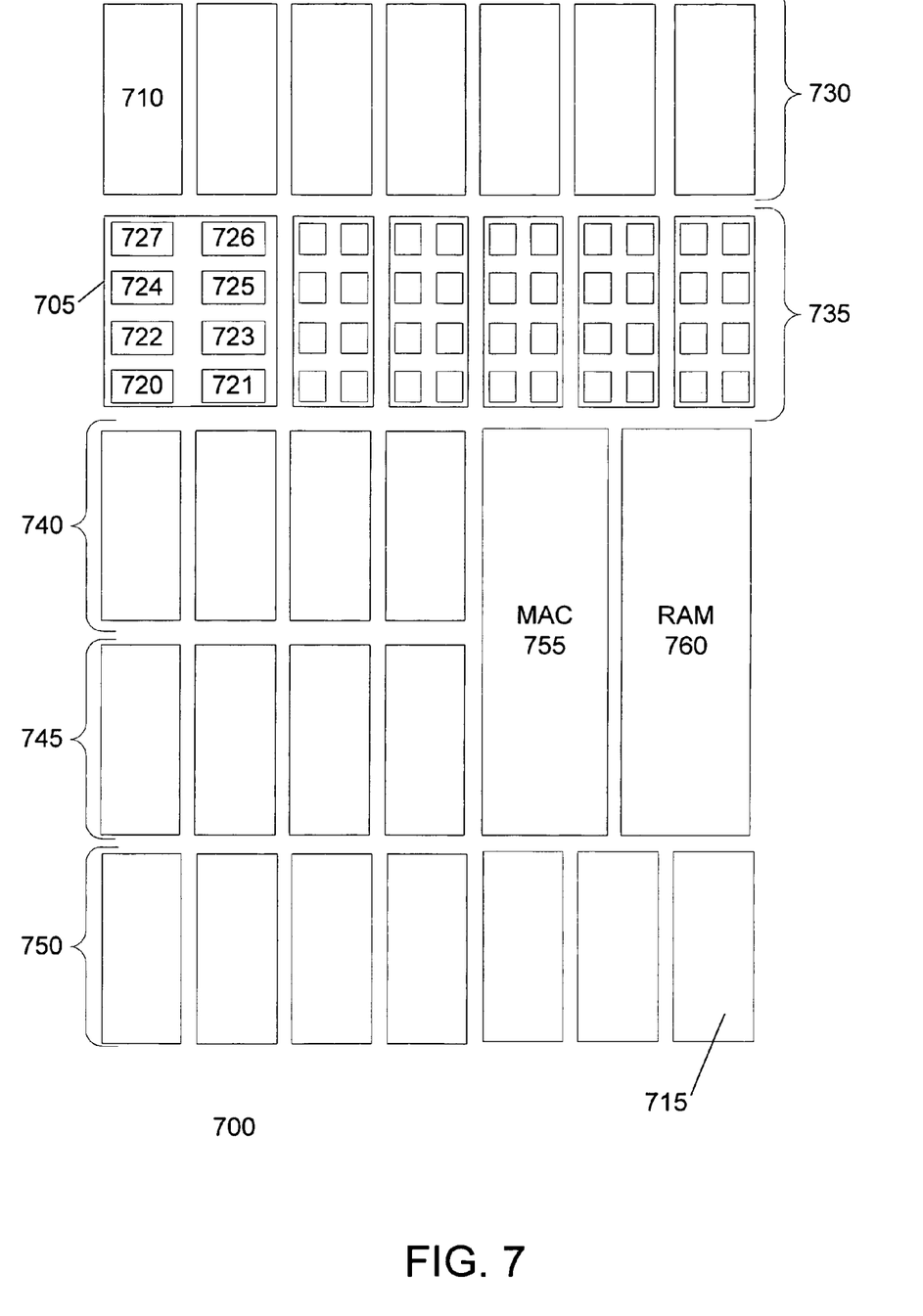
FIG. 7 illustrates an example programmable device suitable for use with an embodiment of the invention.

FIG. 7 illustrates an example programmable device suitable for use with an embodiment of the invention. Programmable device 700 includes a number of logic array blocks (LABs), such as LABs 705, 710, 715. Each LAB includes a number of programmable logic cells using logic gates and/or look-up tables to perform logic operations, as well as registers to store and retrieve data. LAB 705 illustrates in detail logic cells 720, 721, 722, 723, 724, 725, 726, and 727. Logic cells are omitted from other LABs in FIG. 7 for clarity. The LABs of device 700 are arranged into rows 730, 735, 740, 745, and 750. In an embodiment, the arrangement of logic cells within a LAB and of LABs within rows provides a hierarchical system of configurable connections of a programmable switching circuit, in which connections between logic cells within a LAB, between cells in different LABs in the same row, and between cell in LABs in different rows require progressively more resources and operate less efficiently.

In addition to logic cells arranged in LABs, programmable device 700 also include specialized functional blocks, such as multiply and accumulate block (MAC) 755 and random access memory block (RAM) 760. The configuration of the programmable device is specified at least in part by configuration data stored in configuration memory 775. The configuration data can include values for lookup tables defining the functions of logic cells; values of control signals for multiplexers and other switching devices used by the configurable switching circuit to route signals between inputs, outputs, logic cells, and functional blocks; and values specifying other aspects of the configuration of the programmable device, such as modes of operation of the programmable device and its assorted functional blocks and logic cells. Configuration memory 775 can also include guardian CRAM cells as described above. Although the configuration memory 775 is shown in FIG. 7 as a monolithic unit, in some programmable devices, configuration memory 775 is scattered all over the programmable device. In these types of programmable devices, portions of the configuration memory can lie within the logic cells, functional blocks, and configurable switching circuit of the programmable device.

For clarity, the portion of the programmable device 700 shown in FIG. 7 only includes a small number of logic cells, LABs, and functional blocks. Typical programmable devices will include thousands or tens of thousands of these elements.

Figure 8:
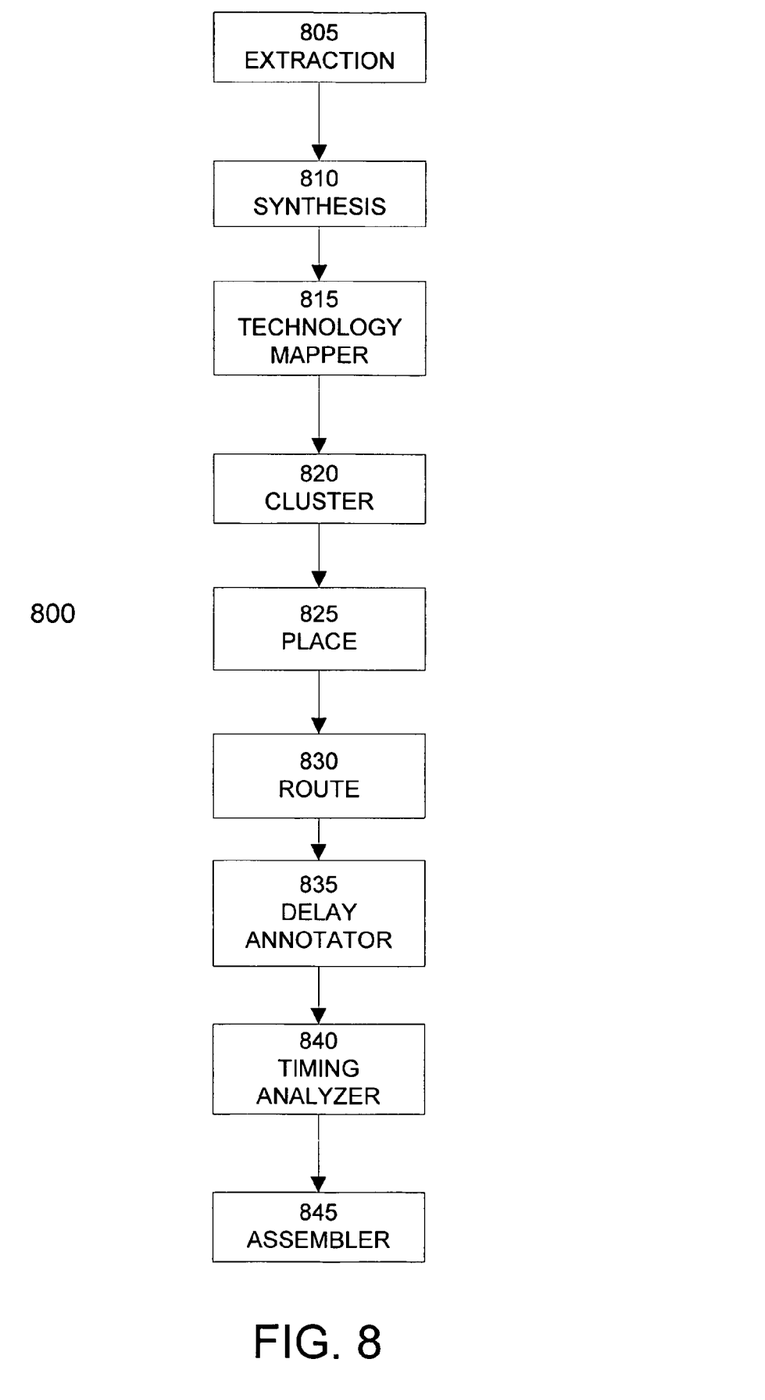
FIG. 8 illustrates an example compilation process suitable for creating configuration data for use with an embodiment of the invention.

FIG. 8 illustrates an example compilation process 800 suitable for creating configuration data for use with an embodiment of the invention. The compilation process 800 converts a user design into a programmable device configuration adapted to configure a programmable device to implement the user design. The extraction phase 805 converts a description of the user design, expressed for example in a hardware description language, into a register transfer layer description.

Synthesis phase 810 converts the register transfer layer description of the user design into a set of logic gates. Embodiments of the synthesis phase 810 can select between equivalent logic gates to improve resistance to soft errors, as described above. Technology mapping phase 815 subdivides the set of logic gates into a set of atoms, which are groups of logic gates matching the capabilities of the logic cells or other functional blocks of the programmable device. A given user design may be converted into any number of different sets of atoms, depending upon the underlying hardware of the programmable device used to implement the user design.

Following the technology mapping phase 815, the cluster phase 820 groups related atoms together into clusters. The place phase 825 assigns clusters of atoms to locations on the programmable device. The route phase 830 determines the configuration of the configurable switching circuit of the programmable device used to connect the atoms implementing the user design.

The delay annotator phase 835 determines the signal delays for the set of atoms and their associated connections in the configurable switching circuit using a timing model of the programmable device. The timing analysis phase 840 determines the maximum operating speed of the programmable device when implementing the user design, for example by determining the portions of the user design have the largest signal delay.

The assembler phase 845 generates a set of configuration information specifying the configuration of the programmable device implementing the user design, including the configuration of each of the logic cells used to implement the user design and the configuration of the configurable switching circuit used to connect the logic cells. In an embodiment, the assembler phase 845 also generates configuration data for guardian CRAM cells associated with the CRAM cells used to store the other configuration data. The assembler phase 845 can write the configuration information to a configuration file, which can then be used to configure one or more programmable devices to implement instances of the user design.

Further embodiments can be envisioned to one of ordinary skill in the art after reading the attached documents. For example, although the invention has been discussed with reference to programmable devices, it is equally applicable to any type of digital device in which data integrity needs to be preserved against soft errors, including standard or structured ASICs, gate arrays, and general digital logic devices. In other embodiments, combinations or sub-combinations of the above disclosed invention can be advantageously made. The block diagrams of the architecture and flow charts are grouped for ease of understanding. However it should be understood that combinations of blocks, additions of new blocks, re-arrangement of blocks, and the like are contemplated in alternative embodiments of the present invention.

The specification and drawings are, accordingly, to be regarded in an illustrative rather than a restrictive sense. It will, however, be evident that various modifications and changes may be made thereunto without departing from the broader spirit and scope of the invention as set forth in the claims.

What is claimed is:

1. A configuration memory for a programmable device, the configuration memory comprising:
    a first configuration memory cell adapted to specify a portion of a configuration of the programmable device, wherein the first configuration memory cell includes a first node adapted to store a first voltage potential corresponding with a configuration bit value and a first transistor connected with a first voltage potential source; and
    a guardian configuration memory cell connected with the first configuration memory cell and adapted to store a guardian bit, wherein in response to the guardian bit having a first guardian bit value, the first transistor is adapted to hold the first node at the first voltage potential.

2. The configuration memory of claim 1, wherein the guardian configuration memory cell includes a second node, and wherein the first transistor is connected with the second node such that the first transistor electrically connects the first node with the first voltage potential source in response to the guardian bit having the first value.

3. The configuration memory of claim 2, wherein the second node is adapted to store a second voltage potential corresponding with the first guardian bit value.

4. The configuration memory of claim 2, wherein the second node is adapted to store a second voltage potential corresponding with the logical inverse of the first guardian bit value.

5. The configuration memory of claim 2, wherein the connection between the first transistor and the second node includes an inverter.

6. The configuration memory of claim 1, wherein the first voltage potential source has a ground potential.

7. The configuration memory of claim 1, wherein the first voltage potential source has a Vcc potential.

8. The configuration memory of claim 1, further comprising:
    a second configuration memory cell adapted to specify a portion of a configuration of the programmable device, wherein the second configuration memory cell includes a second node adapted to store a second voltage potential corresponding with a second configuration bit value and a second transistor connected between the second node and the first voltage potential source; and
    a second guardian configuration memory cell connected with the second configuration memory cell and adapted to store a second guardian bit, wherein in response to the second guardian bit having the first guardian bit value, the second transistor is adapted to hold the second node at the second voltage potential.

9. The configuration memory of claim 1, further comprising:
    a second configuration memory cell adapted to specify a portion of a configuration of the programmable device, wherein the second configuration memory cell includes a second node adapted to store a second voltage potential corresponding with a second configuration bit value and a second transistor connected between the second node and the first voltage potential source;
    wherein the guardian configuration memory cell is further connected with the second configuration memory cell, and wherein in response to the guardian bit having the first guardian bit value, the second transistor is adapted to hold the second node at the voltage potential.

10. The configuration memory of claim 9, wherein the first and second configuration memory cells specify at least a portion of a configuration of a single programmable device component.

11. The configuration memory of claim 1, wherein the guardian configuration memory cell is adapted to store the first guardian bit value when the first node is storing a voltage potential corresponding with the most common configuration bit value of the configuration of the programmable device.

12. The configuration memory of claim 1, wherein the configuration is adapted to maximize the number of bits having the most common configuration bit value.

13. A memory comprising:
a first memory cell adapted to store a bit; and
a guardian memory cell connected with the first memory cell and adapted to store a guardian bit, wherein in response to the guardian bit having a first guardian bit value, the first memory cell is adapted to maintain a first bit value for the bit.

14. The memory of claim 13, wherein in response to the guardian bit having a second guardian bit value, the first memory cell is capable of storing a second bit value for the bit.

15. The memory of claim 13, wherein in response to the guardian bit having a second guardian bit value, the first memory cell is capable of storing a first bit value for the bit.

16. The memory of claim 13, further comprising:
a second memory cell adapted to store a second bit and connected with the guardian memory cell, wherein the response to the guardian bit having the first guardian bit value, the second memory cell is adapted to maintain the first bit value for the second bit.

17. The memory of claim 16, wherein the first and second memory cells specify at least a portion of a configuration of a single programmable device component.

18. The memory of claim 13, wherein:
the first memory cell further comprises a first node adapted to store a first voltage potential corresponding with the bit and a first transistor connected with a first voltage potential source; and
the guardian memory cell includes a second node, and wherein the first transistor is connected with the second node such that the first transistor electrically connects the first node with the first voltage potential source in response to the guardian bit having the first guardian bit value.

19. The memory of claim 18, wherein the second node is adapted to store a second voltage potential corresponding with the first guardian bit value.

20. The memory of claim 18, wherein the second node is adapted to store a second voltage potential corresponding with the logical inverse of the first guardian bit value.

21. The memory of claim 18, wherein the connection between the first transistor and the second node includes an inverter.

22. The memory of claim 18, wherein the first voltage potential source has a ground potential.

23. The memory of claim 18, wherein the first voltage potential source has a Vcc potential.

* * * * *